United States Patent [19]

Yoshitake

[11] Patent Number: 4,855,863
[45] Date of Patent: Aug. 8, 1989

[54] INTEGRATED CIRCUIT HAVING TWO CIRCUIT BLOCKS THEREIN INDEPENDENTLY ENERGIZED THROUGH DIFFERENT POWER SUPPLY TERMINALS

[75] Inventor: Kazuki Yoshitake, Tokyo, Japan
[73] Assignee: NEC Corporation, Tokyo, Japan
[21] Appl. No.: 79,386
[22] Filed: Jul. 30, 1987
[30] Foreign Application Priority Data
Jul. 30, 1986 [JP] Japan .................................. 61-180354
[51] Int. Cl.$^4$ .............................................. H02H 3/20
[52] U.S. Cl. .......................................... 361/91; 361/56; 361/111
[58] Field of Search ...................... 361/56, 86, 91, 110, 361/111; 330/298, 207 P; 357/23.13; 307/296 R

[56] References Cited

U.S. PATENT DOCUMENTS 4,694,315  9/1987  Suedberg ............................ 361/91 X
4,736,271  4/1988  Mack et al. ............................ 361/91

*Primary Examiner*—Derek S. Jennings
*Attorney, Agent, or Firm*—Sughrue, Mion, Zinn, Macpeak & Seas

[57] ABSTRACT

A MOS integrated circuit comprises a semiconductor body, first and second circuit blocks formed separately on the semiconductor body, first and second power supply terminals for supplying a power voltage to the first circuit blocks, the power voltage exclusively energizing the first circuit block, third and fourth power supply terminals for supplying another power voltage to the second circuit block, the other power voltage exclusively energizing the second circuit block, the second and fourth power supply terminals being coupled through the semiconductor body, and a parallel connection of first and second diodes connected between the second and fourth power supply terminals, an anode of the first diode being connected with a cathode of the second diode and a cathode of the first diode being connected with an anode of the second diode.

5 Claims, 3 Drawing Sheets

INTEGRATED CIRCUIT HAVING TWO CIRCUIT BLOCKS THEREIN INDEPENDENTLY ENERGIZED THROUGH DIFFERENT POWER SUPPLY TERMINALS

BACKGROUND OF THE INVENTION

1. Field of the Invention:

This invention relates to a semiconductor integrated circuit having at least two circuit blocks therein which are independently energized through different power supply terminals and, more particularly, to a protection structure incorporated therein against an application of abnormally high electrostatic voltage to signal terminals.

2. Description of Related Arts:

In a semiconductor integrated circuit having plural number of circuit blocks each including an electric circuit of MOS field effect transistors, a power is supplied to energize respective circuit blocks through different power supply terminals which are allocated to the respective circuit blocks and formed on the same IC chip. This structure is advantageous in suppressing noise on power wiring that is generated by a current flowing through the power supply wiring and an impedance thereof. The separated power supply terminals decrease the current flowing through each power supply wiring to reduce the voltage change on the power supply wiring based on a change in the current. Such voltage change is applied to the circuit block as the noise.

In the separated power supplying structure, either high or low power voltage terminals are respectively connected to different power wirings, and the remaining power voltage terminals are connected through semiconductor substrate. Moreover, the chip is provided with signal terminals such as input terminals and output terminals which are mainly protected from applicable electrostatic charges by gate protection diodes connected between the respective signal terminals and the power terminals.

If abnormally large electrostatic charges are accumulated on a signal terminal and cause a flow of current between power supply or signal terminals of different circuit blocks, that current transmits through the semiconductor substrate. The resistance of the semiconductor substrate in the discharging path is from several hundreds ohms to several tens hilo-ohms to prolong the time of discharge. The resistance of the substrate generates a large voltage drop, and produces a large difference in electric potential on the substrate. Therefore, a large voltage is applied to gate insulator films of MOS field effect transistors connected to the signal terminal and breaks them down.

SUMMARY OF THE INVENTION

Therefore, it is a primary object of the present invention to provide a semiconductor integrated circuit having at least two separately energized circuit blocks on a single semiconductor body, which is protected against discharge between power supply or signal terminals of the two circuit blocks.

According to the present invention, there is provided a low impedance discharging path between power terminals of different circuit blocks. Such low impedance discharging path may include a pair of diodes connected in forward and reverse directions between the power supply terminals.

In an embodiment of the invention, a semiconductor integrated circuit includes a semiconductor body, at least two circuit blocks formed in the semiconductor body, each of the circuit blocks having two power supply terminals and at least one signal terminal for receiving an input signal, respective one's of the two power supply terminals in different circuit blocks being coupled through first and second diodes so connected between the one's of the two power supply terminals that an anode of the first diode and a cathode of the second diode are connected in common and a cathode of the first diode and an anode of the second diode are connected in common.

Additional parallel connection of third and fourth diodes with an anode of the third diode and a cathode of the fourth diode being connected in common and a cathode of the third diode and an anode of the fourth diode being connected in common may be inserted between the respective others of the two powersupply terminals in different circuit blocks. Power protection diodes having such a breakdown voltage that circuit elements can be protected from voltages applicable between two power supply terminals may be respectively connected between the two power supply terminals in the same circuit block. Gate protection diodes may be inserted between the signal terminals and the power supply terminals.

In accordance with the present invention, the parallel connection of first and second diodes is connected between one's of the two power supply terminals which are electrically coupled through the semiconductor body, that is, a semiconductor substrate or a well region formed in the substrate. Therefore, if a large number of electrostatic charges flow between power supply or signal terminals in different circuit blocks, a voltage generated by the impedance of the semiconductor body is limited by the parallel connection of the first and second diodes. Thus, a high voltage is not produced in the integrated circuit by the electrostatic charges and therefore circuit elements in the integrated circuit are protected from being broken-down.

BRIEF DESCRIPTION OF THE DRAWINGS

The above and other objects, features and advantages of the present invention will become more apparent from the following description taken in conjunction with the accompanying drawings; wherein.

Figure 1:
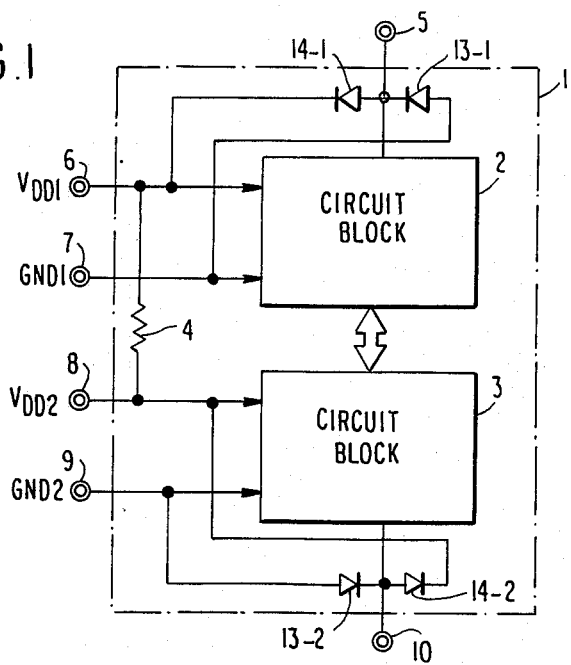
FIG. 1 is a schematical block diagram of a MOS integrated circuit in the prior art.
Figure 2:
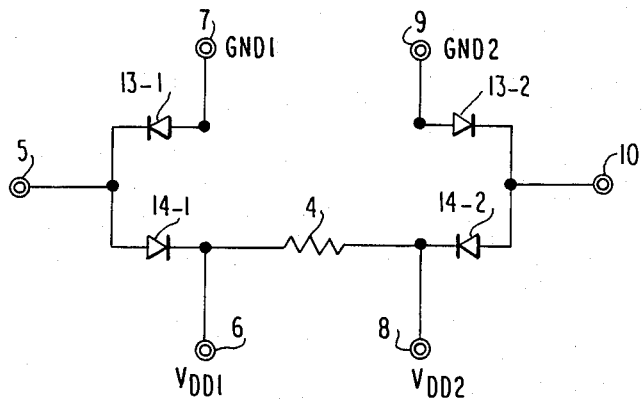
FIG. 2 is an equivalent circuit diagram of the MOS integrated circuit shown in FIG. 1, for showing a part relating to discharging path of electrostatic charges applied to an external terminal.

A MOS integrated circuit having two independent circuit blocks has the circuit blocks 2 and 3 on a single semiconductor substrate 1. The circuit blocks 2 and 3 separately has positive power supply terminals 6 and 8, ground or negative power supply terminals 7 and 8, and several signal terminals 5 and 10. In electrical circuit, the power supply terminals 6 and 8 and the power supply terminals 7 and 9 are not respectively connected to each other. However, the power supply terminals 6 and 8 or the power supply terminals 7 and 9 are generally connected through the semiconductor substrate 1. In the prior art of FIG. 1, the power supply terminals 6 and 8 are connected through the semiconductor substrate 1 which is equivalently shown by the resistor 4 which is a resistance component of the semiconductor substrate 1. The signal terminals 5 and 10 are respectively connected to the power supply terminals 6 and 7 and the power supply terminals 8 and 9 through gate protection diodes 14-1 and 13-1 and gate protection diodes 14-2 and 13-2, respectively. The equivalent circuit of the terminals 5 to 10, the resistor 4 and the gate protection diodes 13-1, 13-2, 14-1 and 14-2 is shown in FIG. 2.

In non-operating state, there are many occasions in which electrostatic charges are applied to any of the terminals 5 to 10 and discharge to one of other terminals 5 to 10. In a case where the discharge is performed between terminals in the same circuit block, charges quickly discharge through the gate protection diodes 13-1, 13-2, 14-1 and 14-2. Any circuit element is not broken down. However, if the discharge occurs between terminals in different circuit blocks, charges slowly discharge through the resistor 4 which is a resistance component of the semiconductor substrate 1. The resistance of the resistor is from several hundreds ohms to several tens kilo-ohms, resulted in a very slow discharging speed. Moreover, a large voltage drop is generated across the resistor 4, causing a large difference in electric potential on the semiconductor substrate. Therefore, a very large voltage is applied across gate insulator films of some MOS field effect transistors to break them down.

DESCRIPTION OF THE PREFERRED EMBODIMENT

Figure 3:
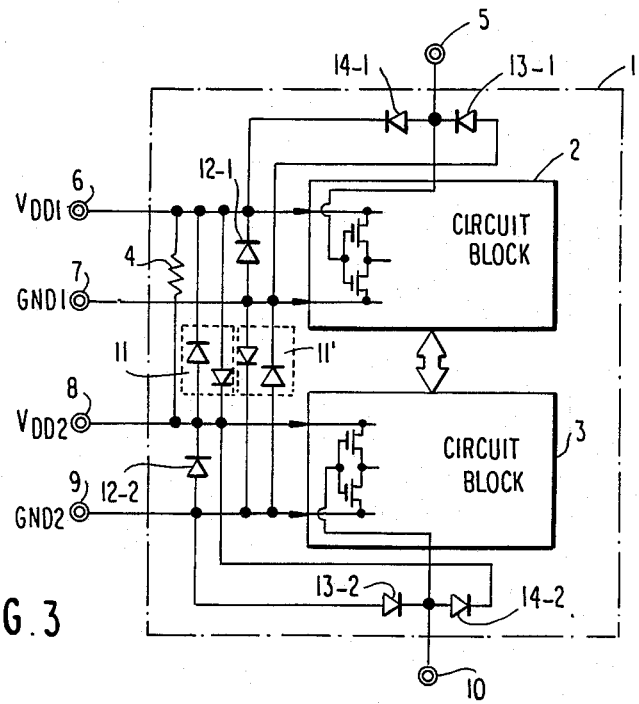
FIG. 3 is a schematical block diagram of a MOS integrated circuit according to a preferred embodiment of the present invention.

The preferred embodiment of the present invention has two separate circuit blocks 2 and 3 made of P-channel type and N-channel type MOS field effect transistors, on the semiconductor substrate 1, as shown in FIG. 3. The circuit block 2 has a power supply terminal 6, a ground terminal 7 and several signal terminal (only an input terminal 5 is shown in FIG. 3). The other circuit block 3 also has a power supply terminal 8, a ground terminal 9 and several signal terminal (only an input terminal 10 is shown in FIG. 3). The same power voltages are separately supplied to the power supply terminals 6 and 8. This separate power supply is effective for preventing a generation of noises in response to a large power current. Wiring for power supply has some impedance component. If a power voltage is applied to both of two circuit blocks with a common power supply wiring, a large current flows through the power supply wiring to produce a large noise based on its impedance component. However, because the power voltages are separately supplied with different power supply wirings, the current flowing through each power supply wiring becomes a half to produce little noise.

The input terminals 5 and 10 are respectively connected to the power terminals 6 and 8 through gate protection diodes 14-1 and 14-2 and further connected to the ground terminals 7 and 9 through gate protection diodes 13-1 and 13-2, respectively. Those gate protection diodes protect MOS field effect transistors having gates connected to the input terminals 5 and 10 from dielectric breakdown of their gate insulator films. The ground terminals 7 and 9 are electrically separated on the semiconductor substrate 1. The power source terminals 6 and 8 are also separated in circuit diagram but are coupled through the semiconductor substrate 1. The resistance component of the substrate 1 between the power supply terminals 6 and 8 is shown with a resistor 4.

Furthermore, the integrated circuit shown in FIG. 3 has two additional protections. One is a protection from applying abnormally high voltage between the power supply terminal and the ground terminal in the same circuit block. For such protection, power protection diodes 12-1 and 12-2 having a breakdown voltage a little higher than a power source voltage are respectively connected between the power supply terminal 6 and the ground terminal 7 and between the power supply terminal 8 and the ground terminal 9.

The other is a protection of circuit element from being damaged when electrostatic charges discharge between terminals in different circuit blocks. For such protection, parallel connections 11 and 11' of the diodes are respectively connected between the power supply terminals 6 and 8 and between the ground terminals 7 and 9. In the parallel connections 11 and 11', anode and cathode of one diode are respectively connected with cathode and anode of the other diode. The function of those parallel connections 11 and 11' will be described in the latter.

Figure 4:
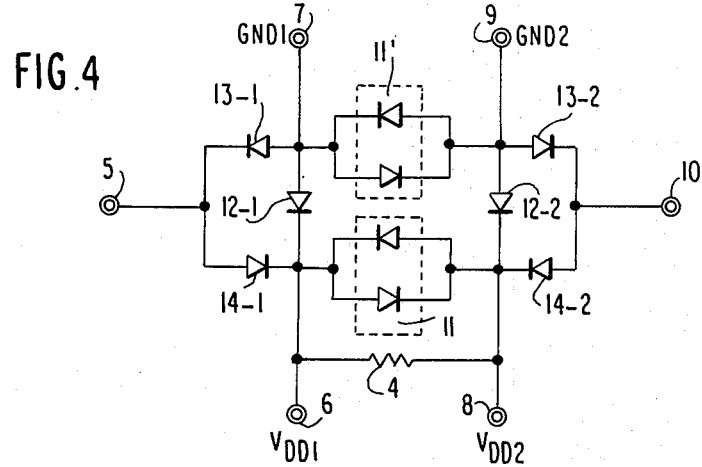
FIG. 4 is an equivalent circuit diagram of the MOS integrated circuit shown in FIG. 3, for showing a part relating to discharging path of electrostatic charges applied to an external terminal.

The equivalent circuit of the diodes shown in FIG. 3 and the resistor 4 is shown in FIG. 4 with terminals 5 to 10. The parallel connection 11 is inserted in parallel with the resistor 4 which is the resistance component of the semiconductor substrate 1 between the power supply terminals 6 and 8. The other parallel connection 11' is inserted between the ground terminals 7 and 9. The diode 12-1 is inserted between the power source terminal 6 and the ground terminal 7 in parallel with a series connection of the gate protection diodes 13-1 and 14-1. The other diode 12-2 is also inserted between the power source terminal 8 and the ground terminal 9 in parallel with a series connection of the gate protection diodes 13-2 and 14-2. The input terminals 5 and 10 are respectively connected at a connecting point of the gate protection diodes 13-1 and 14-1 and another connecting point of the gate protecting diodes 13-2 and 14-2.

All terminals 5 to 10 are in electrically floating condition, before the integrated circuit is mounted on electrical apparatus. Electrical charges may be applied to any of the terminals 5 to 10 and discharge through the integrated circuit to any other terminal. If such electrostatic charges are applied to the power supply terminal 6 and discharge to the other power supply terminal 8, the charges bypass the resistor 4 which is a resistance component of the semiconductor substrate by flowing through the parallel connection 11. The charges flow through one of diodes in the parallel connection 11 in a forward direction with a low impedance. Thus charges quickly discharge. Moreover, the forward biased diode clamps the voltage between the power supply terminals 6 and 8. Any large voltage is not produced in the integrated circuit. Thus, the applied electrostatic charges are quickly discharged without damaging any circuit element in the integrated circuit. The above-explained discharge is equally applicable to the case where electrostatic charges are applied to one of the ground terminals 7 and 9 and discharge to the other of them.

When the applied electrostatic charges discharge between the input terminals 5 and 10, there are many discharging routes. That is, first of such routes is the gate protection diode 13-1 - the parallel connection 11' - the gate protection diode 13-2. Second is the gate protection diode 14-1 - the parallel connection 11 - the gate protection diode 14-2. The gate protection diodes 13-1 and 14-2 break down with a low voltage and show a low impedance. One of diodes in the parallel connection 11 is forward biased by the discharge flow, similar to one of diodes in the other connection 11'. Thus, if charges discharge through those first or second route, the voltage between input terminals 5 and 10 is clamped at a total voltage of a breakdown voltage of the gate protection diode 13-1 or 14-2 and two forward biased voltage of one diode in the parallel connection 11' or 11 and the gate protection diode 14-1 or 13-2. In addition, the impedance between the input terminals 5 and 10 is small, due to the breakdown of the gate protection diode 13-1 or 14-2 and the forward bias of other diodes. Thus, charges quickly discharge without damaging any circuit element in the integrated circuit.

The third of such discharging route is the gate protection diode 14-1 - the parallel connection 11 - the power protection diode 12-2 - the gate protection diode 13-2. The fourth is the gate protection diode 14-1 - the power protection diode 12-1 - the parallel connection 11'- the gate protection diode 13-2. The power protection diodes 12-1 and 12-2 break down at a voltage a little higher than the power voltage and shows a low impedance. Thus, similar to the above-explained first and second routes, the charges quickly discharge with a voltage of the breakdown voltage of the power protection diode 12-1 or 12-2 and two forward biased voltage between the input terminals 5 and 10.

In a case where applied electrostatic charges discharge between the input terminals 5 and 10, if the charges discharge through any route, the charges quickly discharge without damaging any circuit element in the integrated circuit. This fact is similarly applicable to any cases where charges discharge between terminals in the different circuit blocks, such as cases where charges discharge between the input terminal 5 and power supply or ground terminal 8 or 9 and where charges discharge between power supply or ground terminal 7 or 6 and the input terminal 10.

Figure 5:
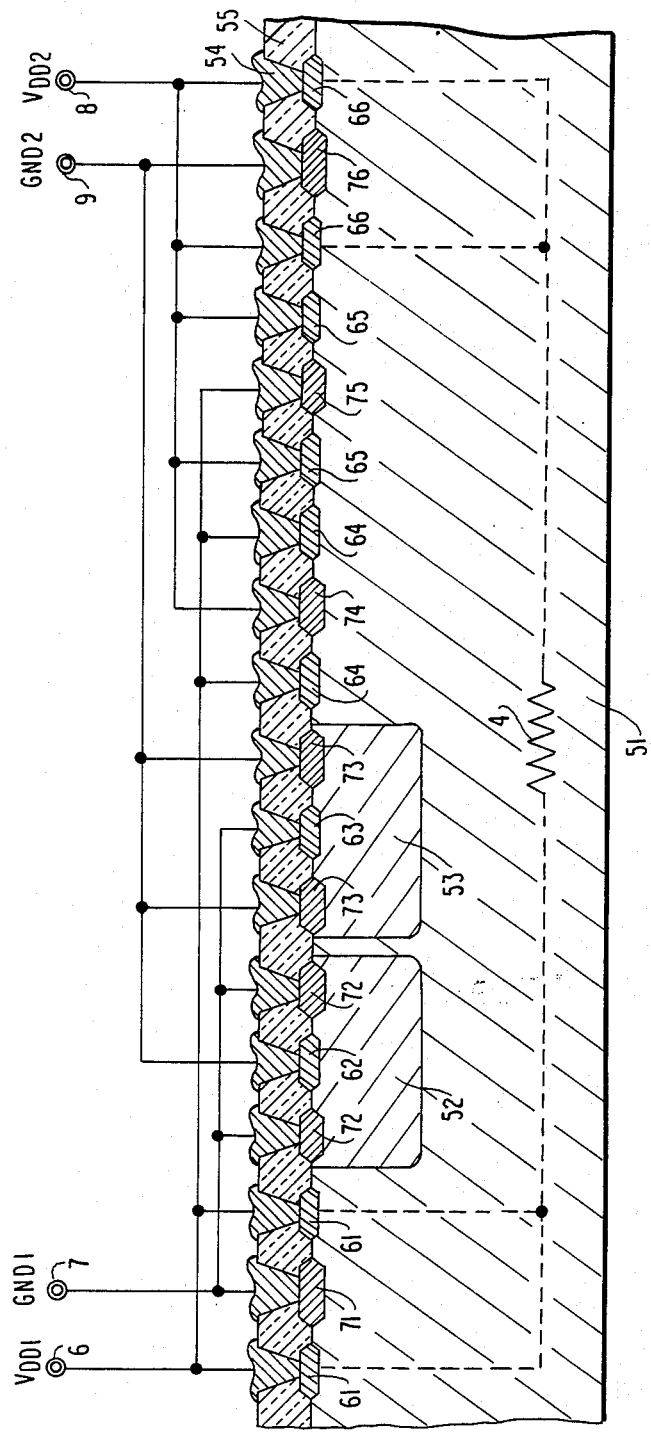
FIG. 5 is a sectional diagram of the MOS integrated circuit for showing diodes shown in FIG. 3.

The parallel connections 11 and 11' and the power protection diodes 12-1 and 12-2 may be formed in a semiconductor device 51, as shown in FIG. 5. An N-type silicon substrate 51 having an impurity concentration of $10^{15} \sim 10^{16}$ cm$^{-3}$ is used. Two P-type well regions 52 and 53 are formed with an impurity concentration of $10^{16}$–$10^{17}$ cm$^{-3}$. Those P-type well regions 52 and 53 are exclusively used for forming the parallel connection 11'. N+-type regions 61 and 64 to 66 are formed on the substrate 51 and N+-type regions 62 and 63 are on the P-type well regions 52 and 53. Those N+-type regions 61 to 66 are formed with an impurity concentration of about $10^{20}$ cm$^{-3}$. P+-type regions 71 and 74 to 76 are formed on the substrate 51 and P+-type regions 72 and 73 are on the P-type well regions 52 and 53. Those P+-type regions 71 to 76 are formed with an impurity concentration of about $10^{20}$ cm$^{-3}$. The N+-type region 61 surround the P+-type region 71 to form the power protection diode 12-1. Similarly, the N+-type region 66 surrounds the P+-type region 76 to form the power protection diode 12-2. The N+-type regions 64 and 65 respectively P+-type regions 74 and 75 to form diodes in the parallel connection 11. The P+-type regions 72 and 73 respectively surround the N+-type regions 62 and 63 to form diodes in the parallel connection 11'. Wirings for forming the circuit shown in FIG. 3 are made with aluminum layer 54 formed on an insulator cover film 55 having openings on the N+-type regions 61 to 66 and the P+-type regions 71 to 76.

In the above-explained preferred embodiment, the parallel connection 11' connected between the ground terminals 7 and 9 may be removed. In such case, the discharging routes of applied electrostatic charges is limited, but the features of quick discharge without producing large voltage are equally achieved by the remaining parallel connection 11. That is, the features of the present invention is achieved by the parallel connection inserted between power terminals which are coupled through the substrate or well-region formed therein. Moreover, although the above-explained embodiment uses the power supply terminals 6 and 8 and the ground terminals 7 and 9, the electrical power may be supplied through positive and negative power supply terminals or positive, ground and negative power supply terminals. In any case, one of the power supply terminals including ground terminals in one circuit block is arranged to couple with corresponding one power supply terminal in different circuit block with an arrangement of a parallel connection of diodes connected between the one and the corresponding one of power supply terminals.

What is claimed is:

1. A MOS integrated circuit comprising:

a semiconductor body;

first and second circuit blocks formed on said semiconductor boy to operate separately with different power supply, said first and second circuit blocks including independent electrical circuits which are formed of P-channel type and N-channel type MOS field effect transistors having a gate electrode;

first and second power supply terminals connected to said first circuit block to supply a first power voltage;

third and fourth power supply terminals connected to said second circuit block to supply a second power voltage, said second and fourth power supply terminals being coupled through said semiconductor body;

a first power protection diode connected between said first and second power supply terminals;

a second power protection diode connected between said third and fourth power supply terminals;

at least one first input terminal connected with said gate electrode of said MOS field effect transistor in said first circuit block;

a first gate protection diode connected between said first input terminal and said first power supply terminal;

a second gate protection diode connected between said first input terminal and said second power supply terminal;

at least one second input terminal connected said gate electrode of said MOS field effect transistor in said second circuit block;

a third gate protection diode connected between said second input terminal and said third power supply terminal;

a fourth gate protection diode connected between said second input terminal and said fourth power supply terminal; and a parallel connection of first and second diodes connected between said second and fourth power supply terminals, an anode of said firs diode being connected with a cathode of said second diode, and a cathode of said first diode being connected with an anode of said second diode;

a parallel connection of third an fourth diodes connected between said first and third power supply terminals, an anode of said third diode being connected with a cathode of said fourth diode, and a cathode of said third diode being connected with an anode of said fourth diode.

2. The MOS integrated circuit as claimed in claim 1, wherein said first and second power protection diodes have such breakdown voltages that said MOS field effect transistors in said first and second circuit blocks can be respectively protected from being broken down by applicable voltages between said first and second power supply terminals and between said third and fourth power supply terminals, and first to fourth gate protection diodes respectively have such a breakdown voltage that said gate electrode of said MOS field effect transistors connected to said first and second input terminals can be protected from being damaged by externally applicable voltages to said first and second input terminals.

3. The MOS integrated circuit as claimed in claim 2, wherein said MOS integrated circuit further comprises another parallel connection of third and fourth diodes connected between said first and third power supply terminals, an anode of said third diode being connected with a cathode of said fourth diode and a cathode of said third diode being connected with an anode of said fourth diode.

4. An integrated circuit comprising:

a semiconductor body;

first and second circuit blocks formed on said semiconductor body, said first circuit block having a first input terminal receiving an external signal and first and second power supply terminals for receiving a power voltage, said second circuit block having a second input terminal receiving an external signal and third and fourth power supply terminals for receiving a power voltage, said first and second power supply terminals having no direct connection to each other, said second and fourth power supply terminals being connected to each other through a resistive component of said semiconductor body, and said first and second circuit blocks being separately operable;

a pair of first and second diodes connected in parallel between said second and fourth power supply terminals, an anode of said first diode being connected with a cathode of said second diode and a cathode of said first diode being connected with an anode of said second diode;

a pair of third and fourth diodes connected in parallel between said first and third power supply terminals, an anode of said third diode being connected with a cathode of said fourth diode and a cathode of said third diode being connected with an anode of said fourth diode;

a fifth diode connected between said first and second power supply terminals and having such a breakdown voltage that circuit elements in said first circuit block can be protected from being damaged by an applicable of voltage between said first and second power supply terminals;

a sixth diode connected between said third and fourth power supply terminals and having such a breakdown voltage that circuit elements in said second circuit block can be protected from being damaged by an applicable of voltage between said third and fourth power supply terminals;

a first input-protection diode connected between said first input terminal and said first power supply terminal;

a second input-protection diode connected between said first input terminal and said second power supply terminal;

a third input-protection diode connected between said second input terminal and said third power supply terminal; and a fourth input-protection diode connected between said second input terminal and said fourth power supply terminal.

5. An integrated circuit as claimed in claim 4, wherein said first and second circuit blocks respectively have an electrical circuit formed of P-channel type and N-channel type MOS field effect transistors, and said semiconductor body has a semiconductor substrate of one conductivity type and well regions of another conductivity type formed on said semiconductor substrate, said second and fourth power supply terminals being coupled through said semiconductor substrate.

* * * * *

UNITED STATES PATENT AND TRADEMARK OFFICE
CERTIFICATE OF CORRECTION

PATENT NO. : 4,855,863

DATED : August 8, 1989

INVENTOR(S) : YOSHITAKE

It is certified that error appears in the above-identified patent and that said Letters Patent is hereby corrected as shown below:

Column 1, line 49, delete "hilo-ohms" and insert --kilo-ohms--;

Column 5, line 55, delete "$10^{16}$-$10^{17}$" and insert --$10^{16}$-$10^{17}$--;

Column 7, line 6, delete "firs" and insert --first--; claim 8, line 35.

Signed and Sealed this

Seventh Day of August, 1990

*Attest:*

HARRY F. MANBECK, JR.

*Attesting Officer*     Commissioner of Patents and Trademarks